(12) United States Patent
Goward

(10) Patent No.: US 10,804,207 B1
(45) Date of Patent: Oct. 13, 2020

(54) INTERPOSER WITH CARBON NANOFIBER COLUMNS

(71) Applicant: Facebook Technologies, LLC, Menlo Park, CA (US)

(72) Inventor: John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/255,462

(22) Filed: Jan. 23, 2019

Related U.S. Application Data

(60) Provisional application No. 62/622,670, filed on Jan. 26, 2018.

(51) Int. Cl.
| | |
|---|---|
| *H05K 3/02* | (2006.01) |
| *H05K 3/10* | (2006.01) |
| *H01L 23/538* | (2006.01) |
| *H01L 21/48* | (2006.01) |
| *H01L 21/683* | (2006.01) |
| *H01L 23/14* | (2006.01) |
| *H01L 33/62* | (2010.01) |
| *H01L 33/24* | (2010.01) |
| *B82Y 40/00* | (2011.01) |
| *H01L 33/42* | (2010.01) |
| *H01L 33/32* | (2010.01) |
| *H01L 33/30* | (2010.01) |

(52) U.S. Cl.
CPC ........ *H01L 23/5384* (2013.01); *H01L 21/486* (2013.01); *H01L 21/6835* (2013.01); *H01L 23/14* (2013.01); *H01L 23/147* (2013.01); *H01L 23/5386* (2013.01); *H01L 33/62* (2013.01); *B82Y 40/00* (2013.01); *H01L 33/24* (2013.01); *H01L 33/30* (2013.01); *H01L 33/32* (2013.01); *H01L 33/42* (2013.01); *H01L 2221/68345* (2013.01); *H01L 2221/68372* (2013.01)

(58) Field of Classification Search
CPC . H01L 23/5384; H01L 33/62; H01L 21/6835; H01L 23/147; H01L 23/14; H01L 23/5386; H01L 21/486; B82Y 40/00; Y10T 29/4913; Y10T 29/49155; Y10T 29/49158
USPC ................................. 29/832, 846, 848, 842
See application file for complete search history.

(56) References Cited

U.S. PATENT DOCUMENTS 6,459,039 B1 * 10/2002 Bezama ............ H01L 23/49827
174/255
8,872,176 B2 * 10/2014 Fang .................. G01R 1/06744
257/48

* cited by examiner

*Primary Examiner* — Donghai D Nguyen
(74) *Attorney, Agent, or Firm* — Fenwick & West LLP

(57) ABSTRACT

Embodiments relate to the fabrication of an interposer with nanofibers by an additive process to electrically connect two or more electronic components. The nanofibers are grown on a substrate away from a surface of the substrate. The nanofibers are plated with a conductive material such that the nanofibers are encompassed in a column of the conductive material. An insulative material fills at least the volume between the columns of conductive material. The substrate and the interposer is the remaining device. The interposer can be combined with a redistribution layer to connect electronic components of dissimilar pitch.

14 Claims, 7 Drawing Sheets

INTERPOSER WITH CARBON NANOFIBER COLUMNS

CROSS-REFERENCE TO RELATED APPLICATION

This application claims priority under 35 U.S.C. § 119(e) to U.S. provisional application No. 62/622,670 filed on Jan. 26, 2018, which is incorporated by reference herein in its entirety.

BACKGROUND

The present disclosure relates an interposer for connecting electronic components, and in particular to, using a plurality of carbon nanofiber columns in the interposer to connect the electronic components.

Conventional techniques for the fabrication of interposers, including laser drilling and the Bosch etch process, remove material to form circular or rectangular column in a silicon wafer. A conductive material is deposited in the column to form a through-silicon via (TSV) to connect electrical components via the interposer. The conductor is typically metallic (e.g. copper, tungsten) or a doped material (e.g. doped silicon, polysilicon). Smaller interposer geometry results in higher electrical resistance, resisting the current flow capability.

Because of the semi-conductive nature of silicon, the side walls of the TSVs must be capped with a dielectric to isolate the conductive core. A barrier layer is generally required between the dielectric and the metal, which provides electrical isolation as well as acting as a diffusion barrier. These thin dielectric and diffusion layers are deposited using atomic layer deposition (ALD) to achieve the extremely thin layers that are required, typically on the order of 10s of nanometers.

Interposers can also be assembled with a glass substrate. Glass interposer substrates are electrical insulators, but may also require a diffusion barrier layer to be deposited before the through vias are plated with a conductive material.

Conventional subtractive methods to create TSVs in the substrate have limited pitch. It is impractical to use conventional methods to create TSVs at the nanoscale because of the need to "drill" or etch the substrate. In particular, the Bosch etch process has limitations in feature size resolution, making it difficult to process below 1 μm due to etch undercutting. Additionally, the small dimensions are a challenge to achieve uniform thin coating thickness of the dielectric and/or diffusion barrier using ALD due to the large aspect ratios that are desires. A new method is required to assemble interposers with a smaller pitch.

SUMMARY

Embodiments relate to an interposer that includes an ordered array of nanofibers and is assembled via an additive process. In particular, the nanofibers may be carbon nanofibers (CNFs). A regular array of free-standing nanofibers is grown on a temporary substrate. The nanofibers are encased in a column of conductive material, forming pillars. The pillars are enclosed in insulative material. This additive process enables assembly of interposers with a pitch, for example, on the order of 2 μm or smaller.

In one or more embodiments, the regular array of nanofibers has an equivalent pitch on both faces of the interposer. The interposer with even pitch allows the electronic connection of electrical components with equivalent pitch.

In one or more embodiments, the interposer incorporates a redistribution layer (RDL) such that the assembly has a finer pitch on one face and a coarser pitch on the other face. The interposer with varying pitch allows the connection of an electronic component with a finer pitch to an electronic component with a coarser pitch.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Embodiments relate to an interposer including an array of nanofibers (e.g. carbon nanofibers), a column of conductive material encompassing the nanofibers, and an insulative material that fills at least the volume between columns of conductive material. To fabricate the interposer, the nanofibers are grown on growth spots of a temporary substrate such that the nanofibers extend away from the surface of the substrate. The conductive material is deposited such that the conductive material encircles the nanofibers along the dimension of nanofiber growth, forming columns of conductive material around the nanofibers. The insulative material is deposited such that the insulative material fills the space between the columns of conductive material. The interposer is used to connect two or more electronic components, which may have electrodes of the same or differing pitch.

Components of the Interposer

Figure 1A:
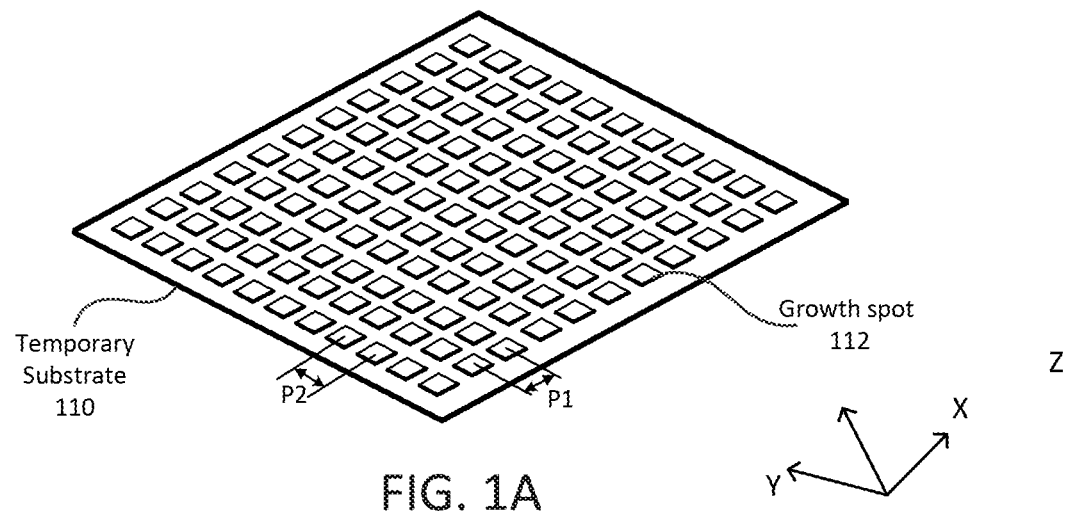
FIG. 1A is a perspective view illustrating a temporary substrate with a regular array of growth spots, according to one embodiment.

FIG. 1A is a perspective view illustrating a temporary substrate 110 with a regular array of growth spots 112, according to one embodiment. The temporary substrate 110 may also be known as a temporary carrier surface. The temporary substrate 110 has a surface in the X-Y plane that is relatively flat. The growth spots 112 take the form of perturbations in the Z-direction of the surface of the temporary substrate. The growth spots 112 may be additive bumps on the surface or subtractive indents that lie below the X-Y plane of the surface.

The temporary substrate 110 can be composed of any material capable of being exposed to the high temperatures involved in the interposer fabrication. In particular, the temporary substrate 110 may be exposed to temperatures in the range of 350° C. to 1200° C. without significant physical damage. These temperature ranges are associated with the deposition temperature of carbon nanofibers (CNFs) in a reactor, in particular a chemical vapor deposition (CVD) reactor. Material selection for the temporary substrate 110 depends on the reactor type and process conditions. Examples of materials that may be used to form the temporary substrate 110 include, but are not limited to, silicon, glass, and high temperature polymers, such as polyimides (PI).

The growth spots 112 are systematically formed roughness on the surface of the temporary substrate 110 that catalyze the growth of nanofibers on the temporary substrate 110. The growth spots 112 can be formed by depositing a conductive material on the temporary substrate 110. The growth spots 112 anchor and facilitate the growth of nanofibers.

The growth spots 112 are spaced such that the individual nanofibers do not grow within a proximity of other fibers of the array. The growth spots 112 can be formed with pitches P1, P2 on the order of 2 μm or smaller. Formation of growth spots 112 with larger scaled pitch is also feasible. In embodiments such as the one shown in FIG. 1A, the growth spots 112 form a regular, ordered array. Other embodiments may have a temporary substrate 110 with growth spots 112 in a non-regular arrangement.

Figure 1B:
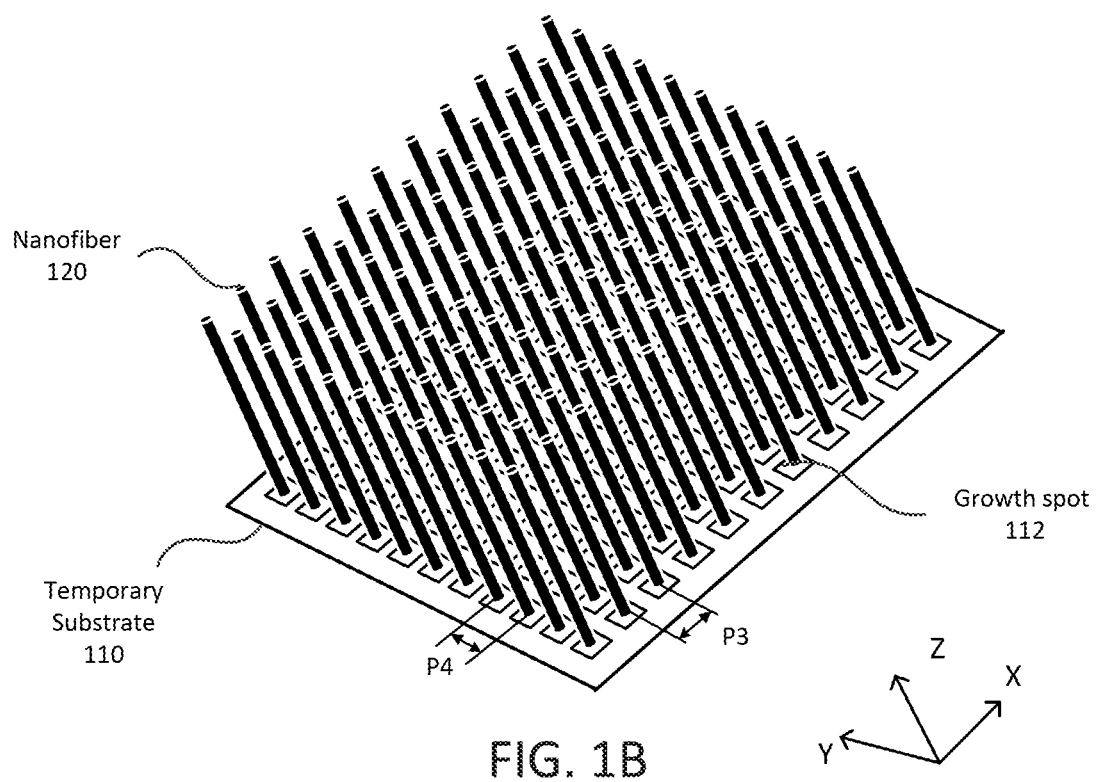
FIG. 1B is a perspective view illustrating a regular array of nanofibers on the temporary substrate, according to one embodiment.

FIG. 1B is a perspective view illustrating a regular array of nanofibers 120 on the temporary substrate 110, according to one embodiment. The nanofibers 120 are grown in the Z-direction such that they extend outward from the surface in the X-Y plane of the temporary substrate 110. In the embodiment shown in FIG. 1B, the nanofibers 120 are parallel to one another in the Z-direction.

The nanofibers 120 are carbon nanofibers (CNFs). Within the temperature range of 350° C. to 400° C., the CNFs can be grown directly on the growth spots 112 of the temporary substrate 110. The pitches P1, P2 of the growth spots 112 (distance between centers of the growth spots 112) corresponds to the pitches P3, P4 of the nanofibers 120 (distance between the centers of the nanofibers 120). The nanofibers 120 can be grown in a regular array, for example, at 1 μm pitch or smaller. The width of the nanofibers 120 is typically on the order of 50 nm. The nanofibers 120 can be grown to a height of 50-75 μm. Higher height of the nanofibers 120 may make the nanofibers 120 become unstable.

The nanofibers 120 are fabricated using chemical vapor deposition (CVD). In one particular embodiment, the CNFs are deposited onto the surface of the temporary substrate 110 using plasma enhanced chemical vapor deposition (PECVD). Controlling the reactor vessel and growth conditions to influence the CNF orientation can be used to grow nanofibers 120 that are metallic CNFs instead of semiconductive. In a particular embodiment, a metal catalyst on the growth spot 112 initiates the growth of the nanofiber 120 below in the Z-direction. The growth catalyst is at the tip of each nanofiber 120 during growth. The growth catalyst can be a transition metal, such as iron (Fe), nickel (Ni), or cobalt (Co). The growth catalyst may be removed during surface finishing before any subsequent bonding steps.

Figure 1C:
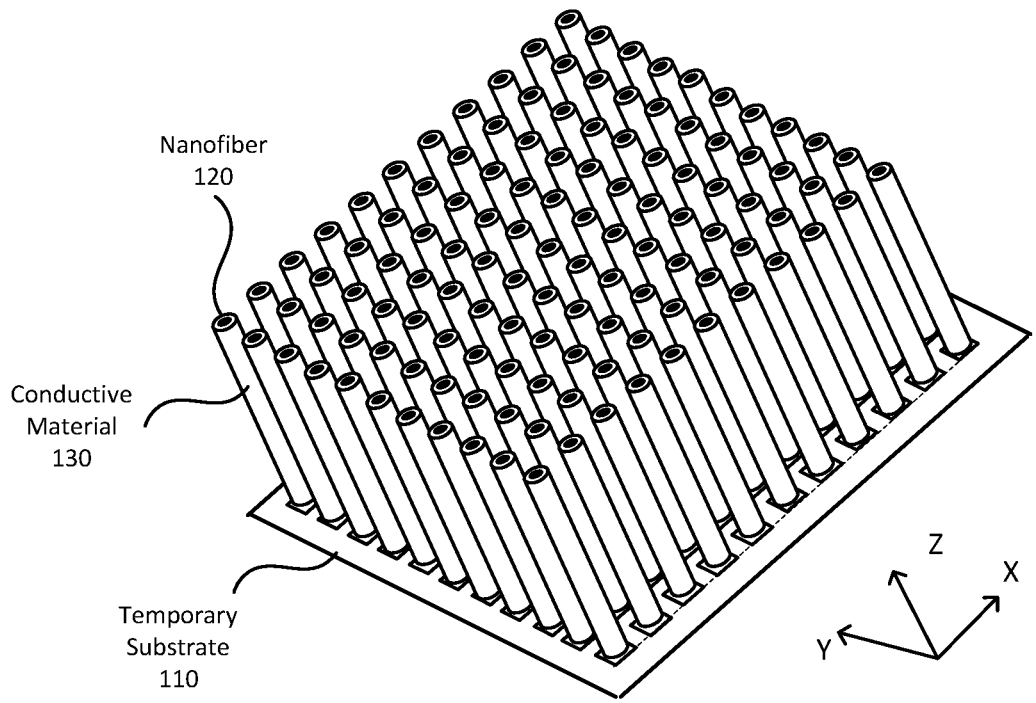
FIG. 1C is a perspective view illustrating the regular array of nanofibers encased in columns of conductive material, according to one embodiment.

FIG. 1C is a perspective view illustrating the regular array of nanofibers 120 encased in columns of conductive material 130, according to one embodiment. The conductive material 130 covers, at least, the nanofibers 120 on the surfaces perpendicular to the direction of nanofiber 120 growth. For example, in the embodiment in FIG. 1C, the conductive material 130 forms columns that extend in the Z-direction to encompass the nanofibers 120 but do not cover the ends of the nanofibers 120 in the X-Y plane.

The conductive material 130 is deposited on the surface of the nanofibers 120 in an additive process. In particular, the conductive material 130 may be electroplated or electroless plated onto the surface of the nanofibers 120. The conductive material 130 may be any material capable of being electroplated, in particular metals such as gold (Au). In the embodiment wherein the nanofibers 120 are on the order of 50 nm in diameter, the conductive material 130 is approximately 100 nm to 200 nm thick. Coating the nanofibers 120 with the conductive material 130 enables a wetting surface for the nanofibers 120 for metallic joining to other surfaces.

Figure 1D:
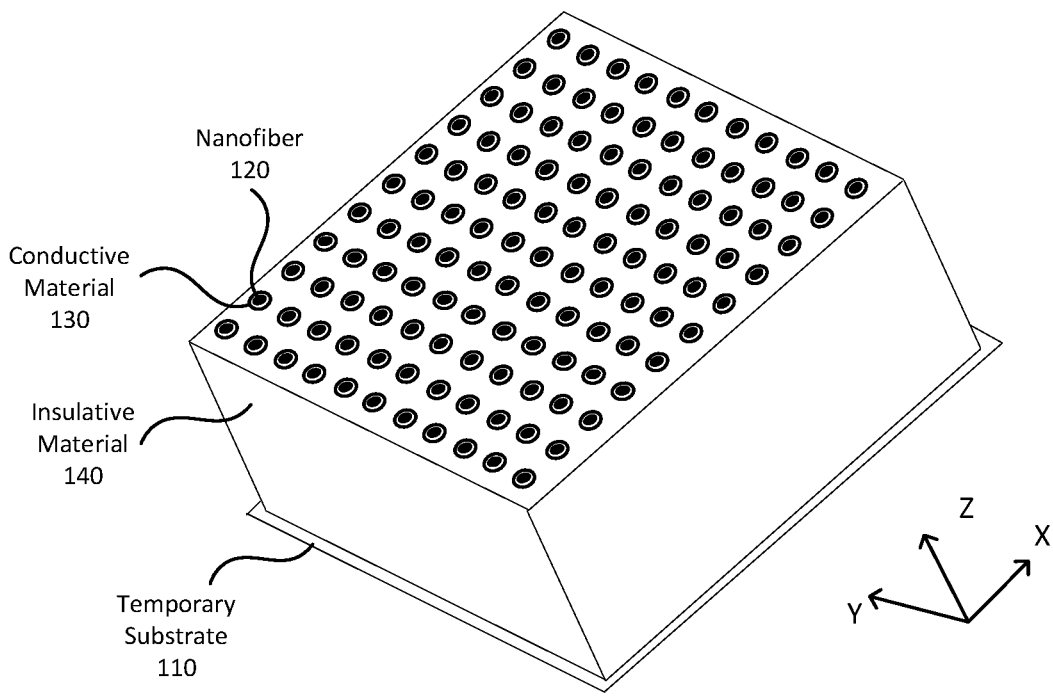
FIG. 1D is a perspective view of conductive material encased nanofibers in a continuous matrix of insulative material, according to one embodiment.

FIG. 1D is a perspective view of conductive material 130 encased nanofibers 120 in a continuous matrix of insulative material 140, according to one embodiment. The insulative material 140 fills the space between the columns of conductive material 130. The insulative material 140 has sufficient strength and rigidity so that the insulative material 140 supports the conductive material encased nanofibers 120 in place after the temporary substrate 110 is removed from the insulative material 140. The insulative material 140 is deposited via an additive process. In particular, the insulative material 140 can be deposited using vacuum deposition processing, spin coating, or spray coating.

The ends of the nanofibers 120 and columns of conductive material 130 remain exposed, as depicted in the embodiment of FIG. 1D. The temporary substrate 110 may be removed such that the ends of the nanofibers 120 and columns of conductive material 130 are exposed on both faces in the X-Y plane. The interposer is formed by removing the temporary substrate 110 from the block of nanofibers 120, conductive material 130 and the insulative material 140. In one embodiment, the temporary substrate 110 is removed by peeling the interposer, allowing for a cleaning cycle and reuse.

In addition to obtaining interposers with smaller pitch, the additive fabrication process described above with reference to FIG. 1A through 1D provides various benefits, among others, the following: First the presented additive method does not encounter many of the problems associated with conventional methods of drilling and plating TSVs, such as formation of side voids during metal filling or non-uniform side wall coverage of the dielectric material.

Second, the use of nanowires provides superior electrical properties at smaller pitch. The electrical properties of the conductors formed as TSVs are reduced with respect to the properties associated with the bulk materials. For example, the ampacity of a copper (Cu) pillar with a diameter of 1 μm is approximately 390 μA, whereas the ampacity of a CNF with a diameter of 50 nm is approximately 7.8 mA. That is, the ampacity is an order of magnitude larger for a CNF that is several orders of magnitude smaller in diameter. The use of CNFs thereby improves the performance of the interposer.

Third, the thickness of the interposer is less restrictive. In an interposer made by forming holes on a silicon wafer, the thickness of the silicon wafer is limited based on the aspect ratio of 10:1 for the via diameter. The smallest TSV is on the order of 1.6 μm, which would result in a thin and fragile layer of interconnecting vias that is less than 20 μm thick. Using the additive fabrication method would facilitate a thicker substrate that could be more easily handled and less prone to stress warpage. Warpage of the interposer limits the number of redistribution layers (RDL) and therefore fanout potential. The additive fabrication method thereby allows for interposers that can have smaller pitch and larger thickness, which can be used to connect electrical components with varying pitches.

Interposer and Electrical Components

Figure 2A:
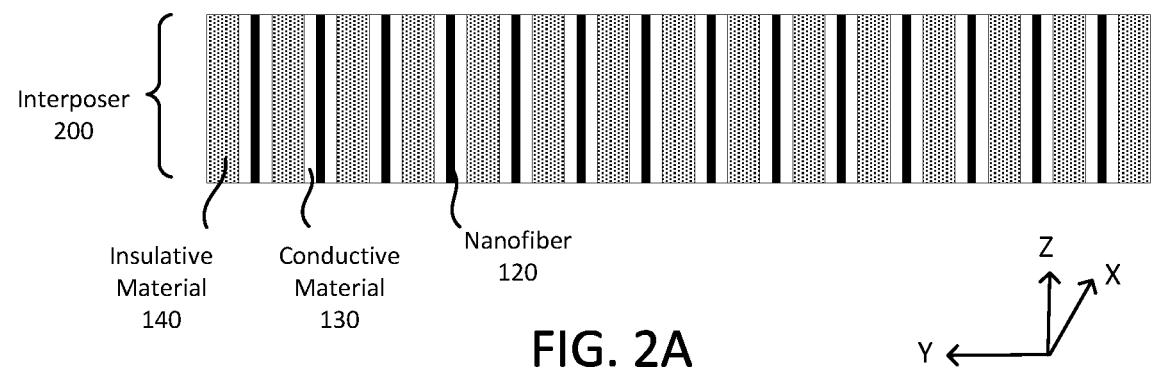
FIG. 2A is a cross-sectional view illustrating an interposer with nanofibers, according to one embodiment.

FIG. 2A is a cross-sectional view illustrating an interposer 200 with nanofibers 120, according to one embodiment. The cross-sectional view depicted is that of the structure in FIG. 1D, with the temporary substrate 110 removed, viewed in the Y-Z plane. The interposer 200 comprises nanofibers 120 encompassed by conductive material 130, with columns of conductive material 130 separated by insulative material 140.

Figure 2B:
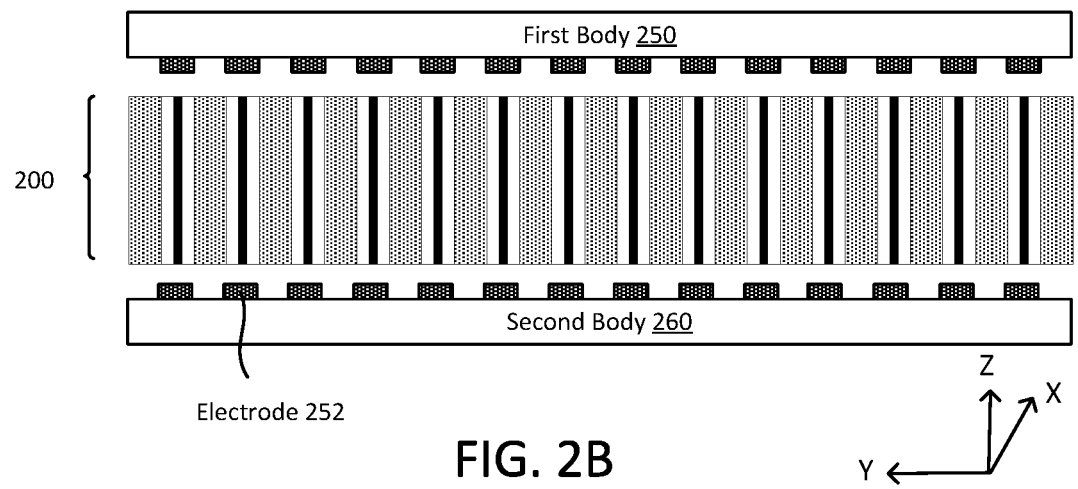
FIG. 2B is a cross-sectional view illustrating the interposer aligned with two electronic components having electrodes spaced with the same pitch, according to one embodiment.

FIG. 2B is a cross-sectional view illustrating the interposer 200 aligned with two electronic components having electrodes of the same pitch, according to one embodiment. The first body 250 and second body 260 are two electronic components with equivalent pitch. The first body 250 and second body 260 each have one or more electrodes 252. The first body 250 and second body 260 may be any discrete electronic device capable of being connected via the interposer 200. The first body 250 and second body 260 may be, for example, a substrate, a chip die, or a light emitting diode (LED), in particular a micro-LED (as described below in detail with reference to FIG. 3). The first body 250 and second body 260 are physically and electronically disconnected prior to being adjoined by the interposer 200.

Figure 2C:
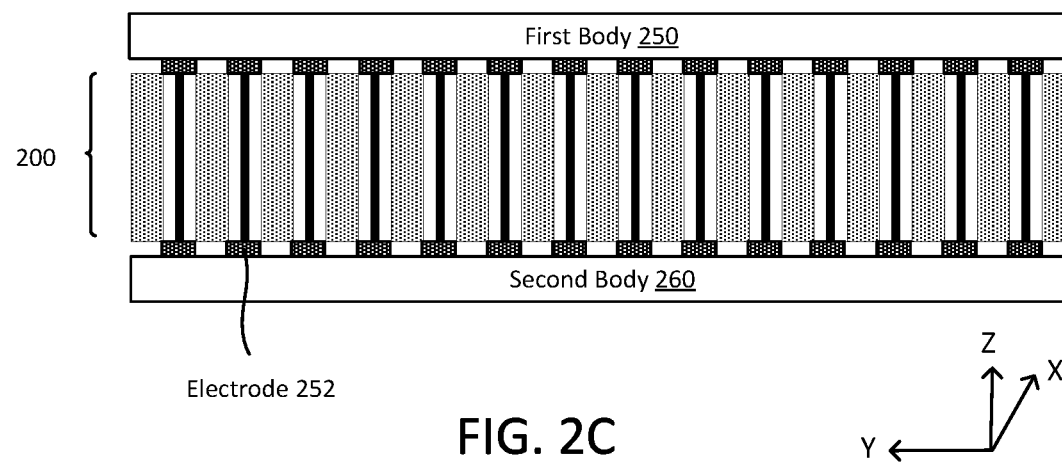
FIG. 2C is a cross-sectional view illustrating the interposer electronically connecting two electronic components of FIG. 2B, according to one embodiment.

FIG. 2C is a cross-sectional view illustrating the interposer 200 electronically connecting two electronic components of FIG. 2B, according to one embodiment. When the first body 250 and second body 260 are moved towards the interposer 200 in the Z-direction from their positions in FIG. 2B, they form the physically and electronically connected device in FIG. 2C. The electrodes 252 and the conductive material 130 encasing the nanofibers 120 provide an electronic connection between the first body 250 and second body 260. In one embodiment, an adhesive underfill layer is applied at the junction between the first body 250 and the interposer 200 and between the second body 260 and the interposer 200.

Figure 2D:
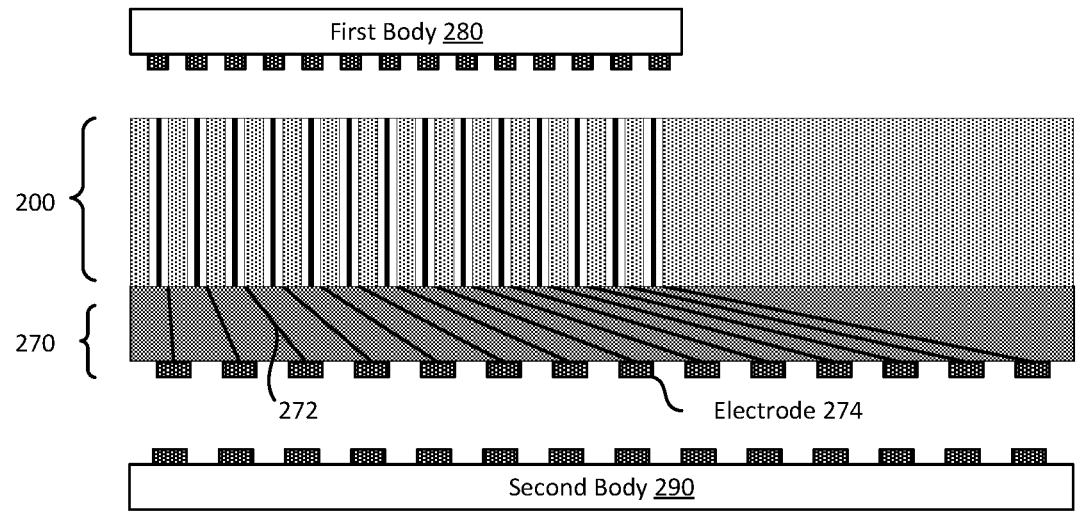
FIG. 2D is a cross-sectional view illustrating the interposer and RDL aligned with two electronic components having electrodes spaced apart with differing pitch, according to one embodiment.

FIG. 2D is a cross-sectional view illustrating the interposer 200 and RDL 270 aligned with two electronic components having electrodes spaced apart with differing pitch, according to one embodiment. The first body 280 and second body 290 are two electronic components having electrodes of with differing pitch. The first body 280, second body 290, and RDL 270 each have one or more electrodes. The first body 280 and second body 290 may be any discrete electronic device capable of being connected via the interposer 200 and RDL 270. The first body 250 and second body 260 are physically and electronically disconnected prior to being adjoined by the interposer 200 and RDL 270.

The RDL 270 is used to fan the pitch outward to allow for the interposer 200 to connect two electronic components of dissimilar pitch. The RDL 270 has conductive traces 272 that span the RDL to connect the columns of conductive material 130 around the nanofibers 120 to the electrodes 274. The conductive traces 272 fan out the pitch such that the interposer 200 has a different pitch from the electrodes 274 on the opposite surface of the RDL 270.

Figure 2E:
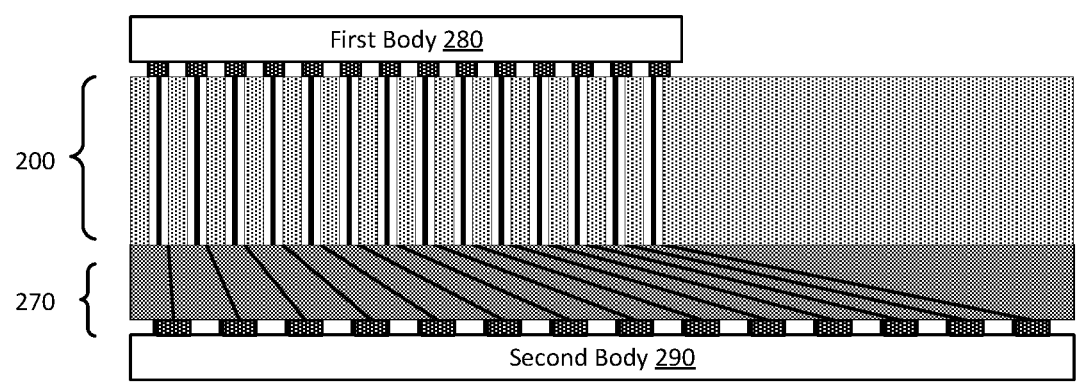
FIG. 2E is a cross-sectional view illustrating the interposer and RDL electronically connecting two electronic components of FIG. 2D, according to one embodiment.

FIG. 2E is a cross-sectional view illustrating the interposer 200 and RDL 270 electronically connecting two electronic components of FIG. 2D, according to one embodiment. When the first body 280 and second body 290 are moved towards the interposer 200 and RDL 270 in the Z-direction from their positions in FIG. 2D, they form the physically and electronically connected device in FIG. 2E. The electrodes 274, conductive traces 272, and the conductive material 130 encasing the nanofibers 120 provide an electronic connection between the first body 280 and second body 290. In one embodiment, an adhesive underfill layer is applied at the junction between the first body 280 and the interposer 200 and between the second body 290 and the RDL 270.

In one particular embodiment, the first body 280 is a micro-LED and the second body 290 is a substrate with a conductive trace. When the micro-LED and substrate are connected in the manner illustrated in FIG. 2E, the conductive trace can provide an electrical current to the micro-LED.

The embodiments discussed in relation to FIGS. 2B through 2D are for purposes of illustration only. The two-dimensional cross-sections provide illustrative clarity. One familiar in the art would recognize the implementation of the present disclosure in three-dimensions. Additional bodies may be connected via the interposer 200. In the embodiments of FIGS. 2D through 2E additional RDLs may be added to align pitch.

Figure 3:
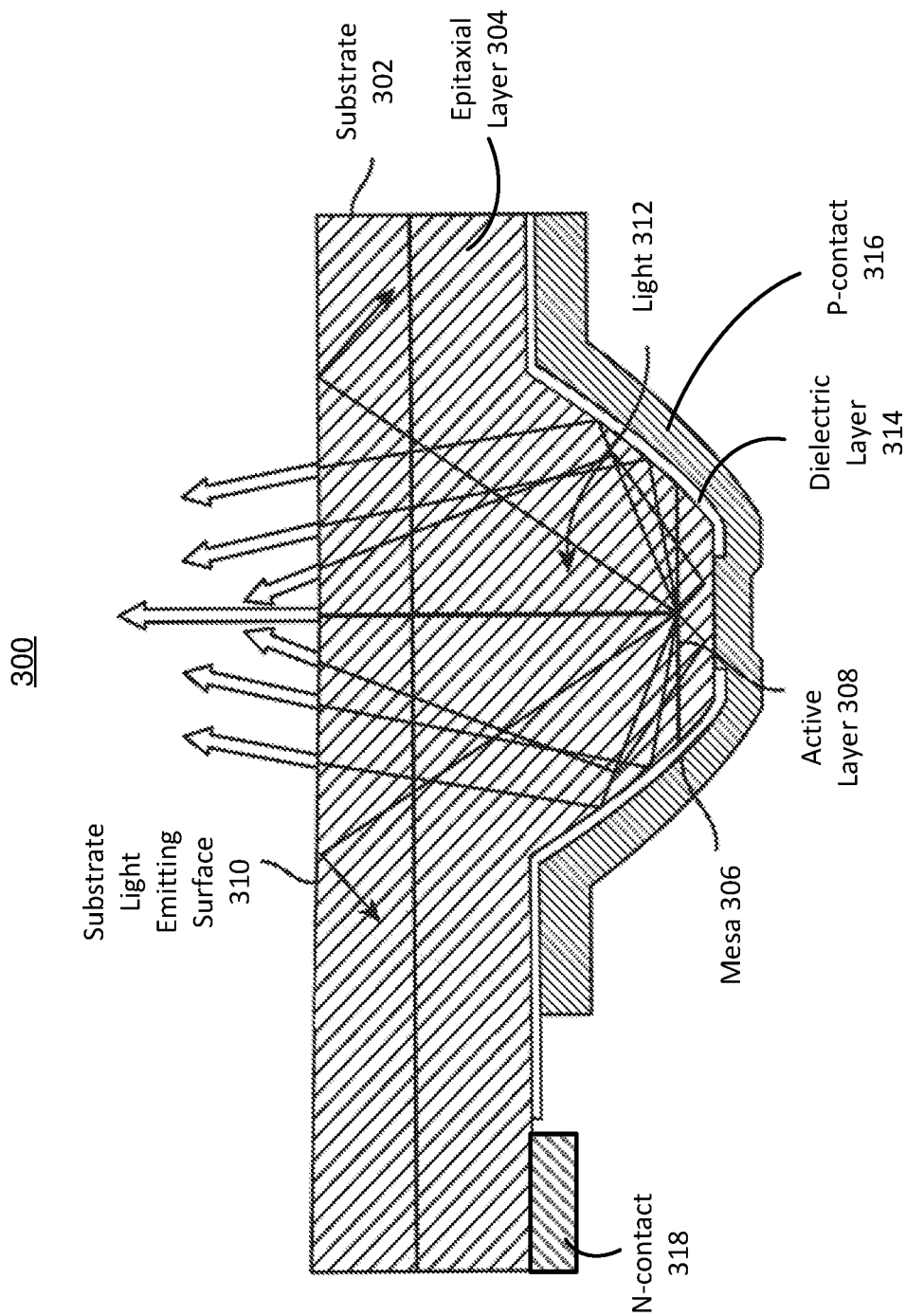
FIG. 3 is a schematic cross-sectional view of a micro-LED, in accordance with one embodiment.

FIG. 3 is a schematic cross-sectional view of a micro-LED 300, in accordance with one embodiment. The interposer 200 may be used to connect the micro-LED 300 to one or more other electronic components. A "micro-LED" described herein refers to a particular type of LED having a small active light emitting area (e.g., less than 2,000 μm$^2$), transparency or substantial transparency to emitted visible light (e.g., from another micro-LED of another display panel), and collimated light output. In particular, the diameter of each micro-LED and the pitch, or spacing between micro-LEDs, is on the order of 0.1-10 μm. The collimated light output increases the brightness level of light emitted from the small active light emitting area. The micro-LED 300 is an example of an electronic component, such as the first body 280 in FIGS. 2D through 2E.

The micro-LED 300 may include, among other components, a LED substrate 302 (or "substrate 302") with a semiconductor epitaxial layer 304 disposed on the substrate 302, a dielectric layer 314 disposed on the epitaxial layer 304, a p-contact 316 disposed on the dielectric layer 314, and an n-contact 318 disposed on the epitaxial layer 304. The epitaxial layer 304 is shaped into a mesa 306. An active (or light emitting) layer 308 (or "active light emitting area") is included in the structure of the mesa 306.

The components of the micro-LED 300 are transparent or substantially transparent for visible light. For example, the LED substrate 302 may include sapphire, or a glass substrate. The epitaxial layer 304 may include gallium nitride (GaN) or Gallium arsenide (GaAs). The active layer 308 may include indium gallium nitride (InGaN). The type and structure of semiconductor material used may vary to produce micro-LEDs that emit colors, and may be selected such that the semiconductor material is transparent for the desired colors of a display panel. The p-contact 616 and n-contact 318 may be contact layers formed from ITO, or some other conductive material that can be transparent at the desired thickness. The transparent or substantially transparent components of the micro-LED 300 result in the micro-LED 300 also being transparent or substantially transparent. In various embodiments, other types of transparent or substantially transparent materials can be used for the components of the micro-LED 300.

The mesa 306 of the epitaxial layer 304 has a truncated top, on a side opposed to a substrate light emitting surface 310 of the substrate 302. The mesa 306 also has a near-parabolic shape to form a reflective enclosure for light generated within the micro-LED 300. The arrows show how light 312 emitted from the active layer 308 is reflected off the internal walls of the mesa 306 toward the light emitting surface 310 at an angle sufficient for the light to escape the micro-LED device 300 (i.e., within an angle of total internal reflection). The p-contact 316 and the n-contact 318 electrically connect the micro-LED 300 to the interposer 200.

The parabolic shaped structure of the micro-LED 300 results in an increase in the extraction efficiency of the micro-LED 300 into low illumination angles when compared to unshaped or standard LEDs. Standard LED dies generally provide an emission full width half maximum (FWHM) angle of 120°. This is dictated by the Lambertian reflectance from a diffuse surface. In comparison the micro-LED 300 can be designed to provide controlled emission angle FWHM of less than standard LED dies, such as around 60°. This increased efficiency and collimated output of the micro-LED 300 can produce light visible to the human eye with only nano-amps of drive current.

The micro-LED 300 may include an active light emitting area that is less than standard inorganic light emitting diodes (ILEDs), such as less than 2,000 $\mu m^2$. The micro-LED 300 directionalizes the light output from the active light emitting area and increases the brightness level of the light output. The micro-LED 300 may be less than 50 µm in diameter with a parabolic structure (or a similar structure) etched directly onto the LED die during the wafer processing steps to form the quasi-collimated light 312 emerging from the substrate light emitting surface 310.

As used herein, "directionalized light" refers to collimated and quasi-collimated light. For example, directionalized light may be light that is emitted from a light generating region of a LED and at least a portion of the emitted light is directed into a beam having a half angle. This may increase the brightness of the LED in the direction of the beam of light.

A micro-LED 300 may include a circular cross section when cut along a horizontal plane as shown in FIG. 3. A micro-LED 300 may have a parabolic structure etched directly onto the LED die during the wafer processing steps. The parabolic structure may include a light emitting region of the micro-LED 300 to generate light, and the parabolic structure reflects a portion of the generated light to form the quasi-collimated light 312 emitted from the substrate light emitting surface 310.

Process for Fabricating Interposer with Nanofibers

Figure 4:
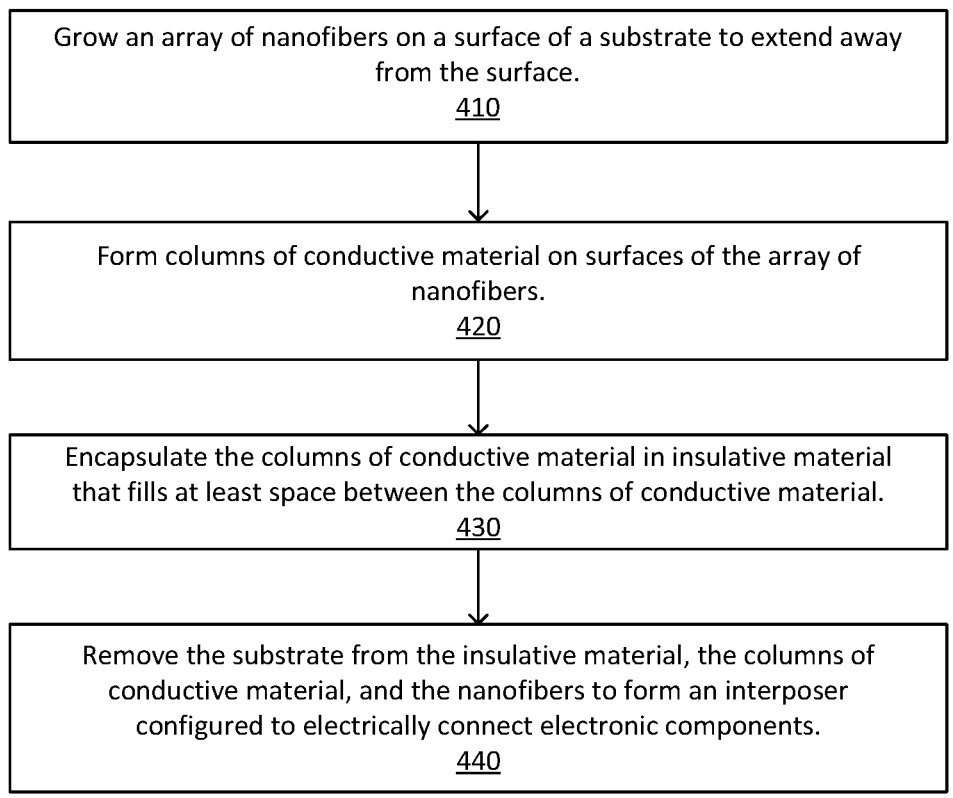
FIG. 4 is a flowchart of a method for fabricating an assembly with nanofibers, a column of conductive material, and a continuum of insulative material, according to one embodiment.

FIG. 4 is a flowchart of a method for fabricating an assembly with nanofibers, a column of conductive material, and a continuum of insulative material, according to one embodiment. The process may include different or additional steps than those described in conjunction to FIG. 4 and some embodiments perform steps in different orders than the order described in conjunction with FIG. 4.

An array of nanofibers is grown 410 on a surface of a substrate such that the nanofibers extend away from the surface of the substrate. FIGS. 1A and 1B show the process of growing 410 the nanofibers, according to one embodiment. Around the nanofibers, columns of conductive material are formed 420 such that the surfaces of the array of nanofibers are encompassed. FIG. 1C shows the conductive material formed 420 on the array of nanofibers, according to one embodiment. The columns of conductive material are encapsulated 430 in insulative material that fills at least the space between the columns of conductive material. FIG. 1D shows the insulative material encapsulating 430 the columns of conductive material, according to one embodiment. The substrate is removed 440 from the insulative material, the columns of insulative material, and the nanofibers to form an interposer configured to electrically connect electronic components. The interposer may be combined with one or more RDLs to electrically connect electronic components of dissimilar pitch.

Figure 5:
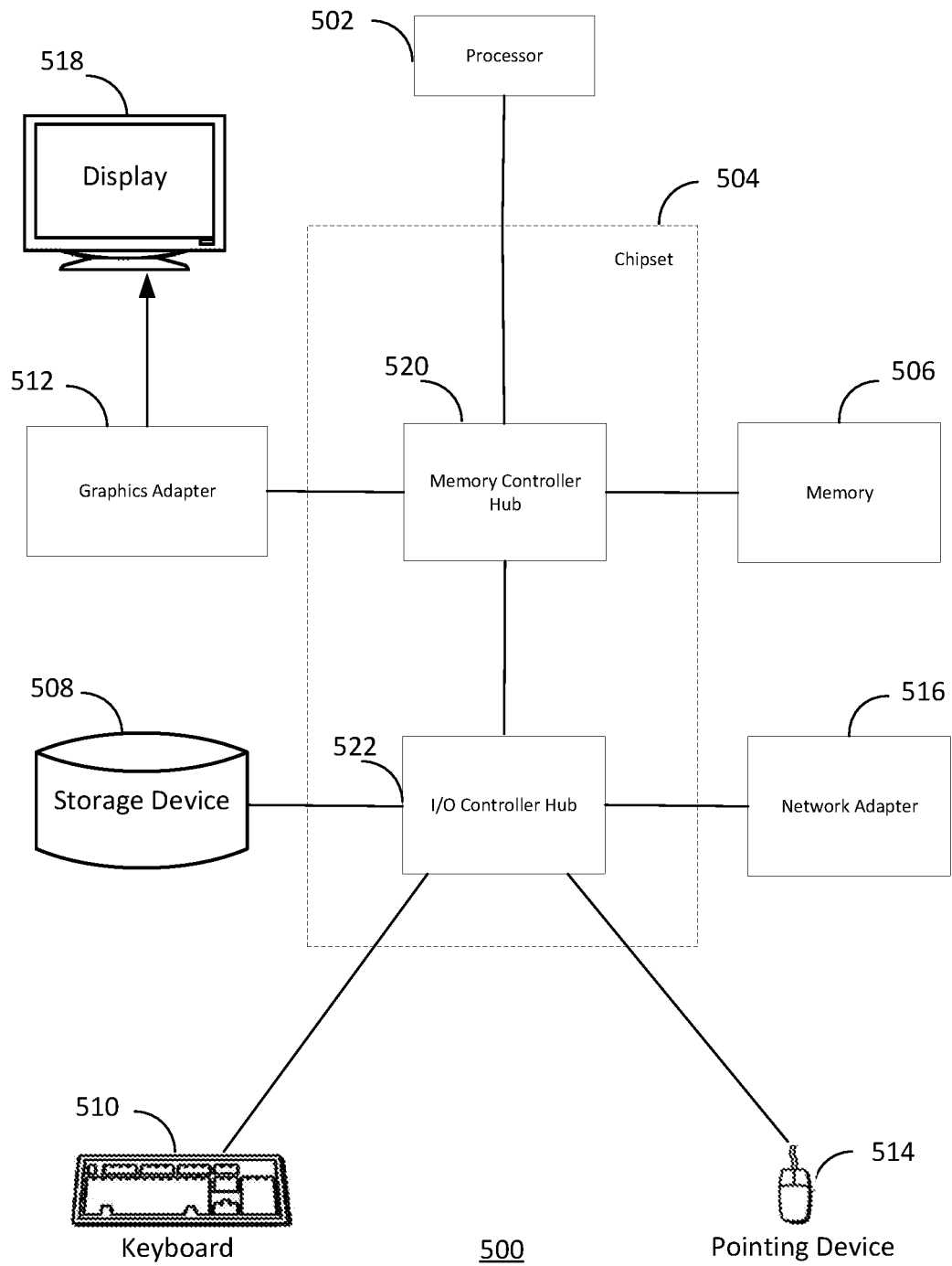
FIG. 5 is a block diagram illustrating a computer system for fabricating an assembly with nanofibers, a column of conductive material, and a continuum of insulative material, according to one embodiment.

FIG. 5 is a block diagram illustrating a computer system for fabricating an assembly with nanofibers, a column of conductive material, and a continuum of insulative material, according to one embodiment. The computer system 500 may be used to control the manufacturing processes discussed herein. For example, the method shown in FIGS. 1A through 1D and the process illustrated by the flowchart of FIG. 4 may be performed under the control of the computer system 500. Illustrated in FIG. 5 are at least one processor 502 coupled to a chipset 504. The chipset 504 includes a memory controller hub 520 and an input/output (I/O) controller hub 522. A memory 506 and a graphics adapter 512 are coupled to the memory controller hub 520, and a display device 518 is coupled to the graphics adapter 512. A storage device 508, keyboard 510, pointing device 514, and network adapter 516 are coupled to the I/O controller hub 522. Other embodiments of the computer system 500 have different architectures. For example, the memory 506 is directly coupled to the processor 502 in some embodiments.

The storage device 508 includes one or more non-transitory computer-readable storage media such as a hard drive, compact disk read-only memory (CD-ROM), DVD, or a solid-state memory device. The memory 506 holds instructions and data used by the processor 502. For example, the memory 506 may store instructions that when executed by the processor 502, configures the processor to perform the processes associated with FIGS. 1A through 1D. The pointing device 514 is used in combination with the keyboard 510 to input data into the computer system 500. The graphics adapter 512 displays images and other information on the display device 518. In some embodiments, the display device 518 includes a touch screen capability for receiving user input and selections. The network adapter 516 couples the computer system 500 to a network. The network may be connected to devices for assembly the first body and the second body according to processes associated with FIGS. 1A through 1D. Some embodiments of the computer system 500 have different and/or other components than those shown in FIG. 5.

The computer system 500 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 508, loaded into the memory 506, and executed by the processor 502. For example, program instructions for the method describe herein can be stored on the storage device 508, loaded into the memory 506, and executed by the processor 502.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
   growing an array of single nanofibers on a surface of a substrate to extend away from the surface;
   forming columns of conductive material on surfaces of the array of single nanofibers after growing the array of single nanofibers;
   encapsulating the columns of conductive material in insulative material that fills at least space between the columns of conductive material on the surfaces of the array of single nanofibers; and
   removing the substrate from the insulative material, the columns of conductive material and the single nanofibers to form an interposer configured to electrically connect a first electronic component at a side of the interposer and a second electronic component at an opposite side of the interposer.

2. The method of claim 1, wherein forming the conductive material comprises plating the conductive material on the surface of the array of single nanofibers by atomic layer deposition.

3. The method of claim 1, wherein the conductive material comprises metal and the nanofibers comprise carbon nanofibers.

4. The method of claim 1, wherein the array of single nanofibers is grown on the surface with a first pitch in a first direction and a second pitch in a second direction perpendicular to the first direction.

5. The method of claim 4, wherein at least one of the first pitch and the second pitch is on the order of 1 micrometer or smaller.

6. The method of claim 1, wherein the insulative material comprises silicon.

7. The method of claim 1, further comprising attaching or forming a redistribution layer on the side or the opposite side of the interposer.

8. The method of claim 1, wherein growing the plurality of single nanofibers comprises:
   depositing a growth catalyst on selected portions of the surface of the substrate; and
   performing chemical vapor deposition on the substrate.

9. The method of claim 8, further comprising removing the growth catalyst from open ends of the nanofibers after growing the plurality of nanofibers.

10. An interposer fabricated by a method comprising:
    growing an array of single nanofibers on a surface of a substrate to extend away from the surface;
    forming columns of conductive material on surfaces of the array of single nanofibers after growing the array of single nanofibers;
    encapsulating the columns of conductive material in insulative material that fills at least space between the columns of conductive material on the surfaces of the array of single nanofibers; and
    removing the substrate from the insulating material, the columns of conductive material and the single nanofibers to form an interposer configured to electrically connect a first electronic component at a side of the interposer and a second electronic component at an opposite side of the interposer.

11. The interposer of claim 10, wherein the array of single nanofibers is grown on the surface with a first pitch in a first direction and a second pitch in a second direction perpendicular to the first direction, at least one of the first pitch and the second pitch on the order of 1 micrometer or smaller.

12. The interposer of claim 10, wherein the method further comprises attaching or forming a redistribution layer on the side or the opposite side of the interposer.

13. The interposer of claim 10, wherein the plurality of single nanofibers is grown by:
    depositing a growth catalyst on selected portions of the surface of the substrate; and
    performing chemical vapor deposition on the substrate.

14. The interposer of claim 13, wherein the growth catalyst is removed from open ends of the nanofibers after growing the plurality of single nanofibers.

* * * * *